United States Patent
Jung

(10) Patent No.: US 11,262,272 B2
(45) Date of Patent: Mar. 1, 2022

(54) ADAPTIVE REMAINING USEFUL LIFE ESTIMATION METHOD USING CONSTRAINT CONVEX REGRESSION FROM DEGRADATION MEASUREMENT

(71) Applicant: Palo Alto Research Center Incorporated, Palo Alto, CA (US)

(72) Inventor: Deokwoo Jung, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 273 days.

(21) Appl. No.: 16/156,995

(22) Filed: Oct. 10, 2018

(65) Prior Publication Data
US 2020/0116585 A1    Apr. 16, 2020

(51) Int. Cl.
*G01M 5/00*     (2006.01)

(52) U.S. Cl.
CPC .................. *G01M 5/0033* (2013.01)

(58) Field of Classification Search
CPC combination set(s) only.
See application file for complete search history.

(56) References Cited

U.S. PATENT DOCUMENTS

| 8,725,456 B1* | 5/2014 | Saha | G05B 23/0283 |
| | | | 702/181 |
| 2003/0065409 A1* | 4/2003 | Raeth | G05B 23/0254 |
| | | | 700/31 |
| 2008/0223668 A1* | 9/2008 | Stucky | D07B 1/145 |
| | | | 187/393 |
| 2010/0121609 A1* | 5/2010 | Gorinevsky | G05B 23/0281 |
| | | | 702/183 |
| 2013/0024414 A1* | 1/2013 | Herzog | G05B 23/0243 |
| | | | 706/52 |
| 2014/0236869 A1* | 8/2014 | Fujimaki | G06F 17/16 |
| | | | 706/11 |
| 2016/0223617 A1* | 8/2016 | Tao | G01R 31/392 |

FOREIGN PATENT DOCUMENTS

| CN | 107238800 A | 10/2017 |
| DE | 112014004166 T5 | 5/2016 |

OTHER PUBLICATIONS

Emanuele Fumeo et al. "Condition Based Maintenance in Railway Transportation Systems Based on Big Data Streaming Analysis", Procedia Computer Science, vol. 53, Jan. 1, 2015, pp. 437-446, XP055459476, Amsterdam, NL ISSN: 1877-0509, DOI:10.1016/j.procs.2015.07.321 section 3.

(Continued)

*Primary Examiner* — Jennifer Bahls
(74) *Attorney, Agent, or Firm* — Shun Yao; Yao Legal Services, Inc.

(57) ABSTRACT

One embodiment can provide a system for estimating useful life of a load-bearing structure. During operation, the system can perform a degradation measurement on the structure to obtain degradation data for a predetermined time interval, apply a constraint convex regression model to the degradation data, estimate a total useful life (TUL) of the structure based on outputs of the constraint convex regression model, and predicting a remaining useful life (RUL) based on the TUL and a current time.

17 Claims, 14 Drawing Sheets

(56) References Cited

OTHER PUBLICATIONS

Soualhi Abdenour et al. "Bearing Health Monitoring Based on Hilbert-Huang Transform, Support Vector Machine, and regres", IEEE Transactions on Instrumentation and measurement, IEEE Service Center, Piscataway, NJ, US, vol. 64, No. 1, Jan. 1, 2015, pp. 52-62, XP011566420, issn; 0018-9456, doi;10.1109/TIM.2014. 2330494 [retrieved on Dec. 5. 2014] Figures 6,7.

* cited by examiner

Algorithm 1: Particle generator algorithm for returning Brownian Motion (BM) Particles with BM parameters 1 function ParticleGenerator
$(t_n, y_n, \hat{\beta}_n, \hat{k}_n, \mathbf{z}_n, \Delta t, \Delta \beta_{prv}, \hat{\sigma}_{prv}, \eta)$
  Input : current time, measurement, particle states $(t_n, y_n, \mathbf{z})$, current convex regression parameter estimates, $(\hat{\beta}_n, \hat{k}_n)$ next prediction time interval $\Delta t$, particle parameters $(\Delta\beta, \hat{\sigma}_e, \eta)$
  Output: $(\mathbf{z}_{next}, \Delta\beta, \hat{\sigma}_e)$
2 $\hat{y}_{t+\Delta t} \leftarrow (1 + \hat{\beta}_n(t_n + \Delta t))^{-\frac{1}{\hat{k}_n}}$
3 $\Delta y \leftarrow \hat{y}_{t+\Delta t} - y_n$
4 if $\Delta y < \infty$ then
5 $\quad |\quad \Delta\beta \leftarrow \Delta y / \Delta t, \quad \hat{\sigma}_e \leftarrow \eta|\Delta y|$
6 else
7 $\quad |\quad \Delta\beta \leftarrow \Delta\beta_{prv}, \quad \hat{\sigma}_e \leftarrow \hat{\sigma}_{prv}$
8 end
9 $\mathbf{z}_{next} \sim \mathcal{N}(\mathbf{z}_n + \Delta\beta\Delta t, \hat{\sigma}_e)$
10 return $(\mathbf{z}_{next}, \Delta\beta, \hat{\sigma}_e)$

FIG. 6A

Algorithm 2: Particle lifetime estimator to predict particle lifetime using convex regression model 1 function ParticleLifetimeEst ($z$)
   Input : Particle state $z$
   Output: Particle lifetime estimates L
2  for $z = \{z_i\}_{i=1,\ldots,q}$ do
3     $l_i \leftarrow$ A4.RUL_Estimator($z_i$)
4     if $l_i$ *exist* then
5        $L[i] \leftarrow l_i$
6     else
7        $L[i] \leftarrow \infty$
8     end
9  end
10 return L

FIG. 6B

Algorithm 3: Particle weight estimator to estimate a weighted mean and variance of particles' lifetime 1 function ParticleWeightEst ($z_n$, $y_n$, $\hat{\sigma}_e$)

Input : Particle state $z_n$, degradation measurement $y_n$, particle variance estimate $\hat{\sigma}_e$

Output: Particles' weight estimates $w$

2    $w \leftarrow \mathcal{N}(z_n | y_n, \hat{\sigma}_e)$

3    $w \leftarrow w / \sum w$ 4    return $w$

FIG. 6C

Algorithm 4: Compute weight average of variance of RUL for a normal distribution given particles' lifetime and the current time 1 function RULDistEst ($w_n, \hat{L}_n, t_n$)

Input : Particle lifetime estimates $\hat{L}$, Particles' weight estimates $w$

Output: Normal distribution's mean $\hat{\mu}_l$ and variance $\hat{\sigma}_l^2$ for RUL $\sim \mathcal{N}(l|\hat{\mu}_l, \hat{\sigma}_l)$ 2  $\hat{\mu}_l \leftarrow w_n \bullet \hat{L}_n / \sum w$ 3  $\hat{\sigma}_l^2 \leftarrow w \bullet (\hat{L}_n - \hat{\mu}_l^2) / \sum w$ 4  return $\hat{\mu}_l, \hat{\sigma}_l^2$

FIG. 6D

ADAPTIVE REMAINING USEFUL LIFE ESTIMATION METHOD USING CONSTRAINT CONVEX REGRESSION FROM DEGRADATION MEASUREMENT

BACKGROUND

Field

This disclosure is generally related to a system and method for fault diagnosis and prognosis. More specifically, this disclosure is related to estimating a remaining useful life (RUL) of engineering structures or equipment, such as load-bearing cables.

Related Art

A typical mechanical or electrical system can develop degradation when a constant stress is applied during operation. Such degradation may accelerate over time, and the system may eventually experience abrupt failure when the stress exceeds the tolerance of the degraded system. To reduce downtime and avoid catastrophic cascading system failure, it is important to continuously predict the remaining useful life (RUL) of the system.

Conventional approaches in predicting the RUL of a system can include continuously performing degradation measurement and stopping the system operation when the degradation measurement exceeds a predetermined threshold. Shortcomings of the conventional approaches can include lack of reliable threshold value and inability to provide probabilistic quantification of system RUL. Unreliable estimation of the threshold value in the degradation measurement can either lead to a premature system shutdown or system failure. The probabilistic quantification of the RUL can be essential in systematically managing the risk of system failure.

SUMMARY

One embodiment can provide a system for estimating useful life of a load-bearing structure. During operation, the system can perform a degradation measurement on the structure to obtain degradation data for a predetermined time interval, apply a constraint convex regression model to the degradation data, estimate a total useful life (TUL) of the structure based on outputs of the constraint convex regression model, and predicting a remaining useful life (RUL) based on the TUL and a current time.

In a variation on this embodiment, the load-bearing structure can include a load-bearing cable, and performing the degradation measurement can include one of: measuring an electrical resistance, measuring a thermal resistance, and measuring a magnetic resistance.

In a variation on this embodiment, the system can further determine whether a measurement recalibration is needed based on the outputs of the constraint convex regression model, and in response to the measurement recalibration being needed, the system can obtain new degradation data.

In a variation on this embodiment, the system can further perform an additional degradation measurement for a subsequent time interval and update the TUL estimation based on the additional degradation measurement.

In a further variation, the system can further use a particle-filtering technique to estimate a probability distribution of the TUL based on the outputs of the constraint convex regression model and the additional degradation measurement.

In a further variation, the particle-filtering technique can include Kalman filtering.

In a variation on this embodiment, the constraint convex regression model can include an asymptotic function.

One embodiment can provide a system for estimating useful life of a load-bearing structure. The apparatus can include one or more sensors embedded in the load-bearing structure, and the sensors are configured to obtain degradation data. The apparatus can further include a constraint convex regression modeling module configured to apply a constraint convex regression model to degradation data associated with a predetermined time interval, a total useful life (TUL) estimation module configured to estimate a TUL of the structure based on outputs of the constraint convex regression model, and a remaining useful life (RUL) prediction module configured to predict an RUL based on the TUL and a current time.

BRIEF DESCRIPTION OF THE FIGURES

FIG. 6A shows the pseudocode for generating the particles, according to one embodiment.

FIG. 6B shows the pseudocode for estimating the lifetime of the particles, according to one embodiment.

FIG. 6C shows the pseudocode for estimating the particles' weights, according to one embodiment.

FIG. 6D shows the pseudocode for estimating the RUL distribution, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

The embodiments described herein solve the technical problem of predicting remaining useful life (RUL) of a structure or system based on degradation measurement. In some embodiments, an RUL-prediction system can obtain degradation measurement data (e.g., resistance measurement) and use a convex constraint regression model to adaptively estimate the RUL. In some embodiments, the RUL-prediction system can use a stochastic constraint convex regression model to adaptively estimate the distribution of the RUL. More specifically, a particle filter can be used to estimate the RUL distribution.

Degradation Measurement

The degradation of a system or a piece of equipment can sometimes result in cracks or microcracks formed in the material. Such material damage can result in change of load-bearing capability. As the degradation develops, the cracks or microcracks grow larger and may eventually lead to equipment failure.

Figure 1:
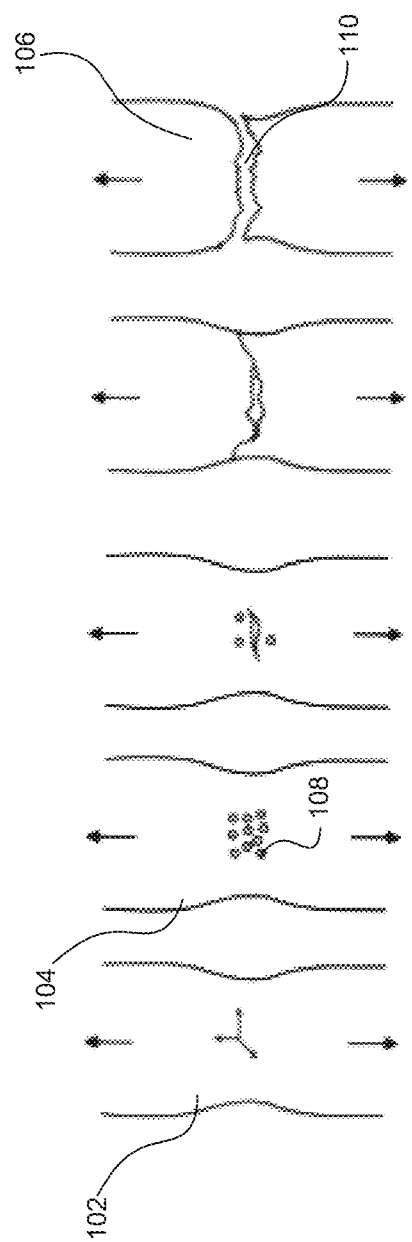
FIG. 1 illustrates the effective load-bearing area of a cable under various crack conditions.

Because the mechanical properties and electrical properties are tightly linked to material structure at both the micro and macro scale, electrical measurement can provide information associated with the material degradation. Using load-bearing cable as an example, microcracks developing in the cable not only affect the load-bearing area but also the current condition path. FIG. 1 illustrates the effective load-bearing area of a cable under various crack conditions. More specifically, FIG. 1 shows a number of cables (e.g., cables 102 and 104) in various degradation conditions. From left to right, the degradation gets worse and worse, and cable 106 is completely broken. As one can see from FIG. 1, the microcracks in each cable (e.g., microcrack 108 in cable 104 or crack 110 in cable 106)) can affect the cross-sectional area of the cable. Because the current-conducting cross-sectional area is equivalent to the load-bearing (or weight-bearing) cross-sectional area of the cable, those microcracks or cracks not only reduce the load-bearing cross-sectional area in the cable, but also reduce the current-conducting cross-sectional area of the cable. Therefore, electrical resistance measurements may provide information associated with damages in the equipment (e.g., cables).

In addition to affecting the current-conducting path, the material damage can also affect other types of conducting path, such as the conducting path for thermal or magnetic energies. Hence, other than electrical resistance measurement, measurement of other types of resistance, such as thermal resistance and magnetic resistance, can also provide information regarding the system or structure degradation. The scope of this disclosure is not limited by the exact form of degradation measurement.

Constraint Convex Regression Model

In an exemplary degradation measurement, one can measure a variable y (e.g., an electrical resistance) over time t from system h with external degradation excitation (e.g., stress). For example, one can collect samples $\{(t_i, y_i)\}_{i=n}$ until system h breaks down. Without loss of generality, one can assume $y_i$ is normalized against its initial value at $t=0$, which sets the initial boundary condition $y_0=1$.

In some embodiments, given degradation measurement of y, a degradation model $\psi$ of system h over time t can be developed such that $y_i = \psi(t_i) + \varepsilon_i$. More specifically, $\psi$ is an unknown convex degradation function and $\varepsilon$ is a measurement noise. The measurement noise is a random variable with mean $E[\varepsilon_i | y_i] = 0$ and variance $Var[\varepsilon_i] < \infty$.

To capture the degradation property of system h, the convex function $\psi$ needs to satisfy both the life-convergence property and the degradation-increasing property, defined in the following formula:

$$\lim_{y \to \infty} \psi^{-1}(y) = l, \ 0 < l < \infty \qquad (1)$$

$$\frac{\partial \psi(t)}{\partial t} > 0, \ \forall \, t \geq 0, \qquad (2)$$

where l is the total useful life (TUL). The first property (indicated by formula (1)) is known as the life-convergence property, which dictates the intuitive asymptotic behavior of degradation where degradation measurement y goes to infinity as remaining useful life l–t goes to zero, where l is the total useful life (TUL). The second property (indicated by formula (2)) is based on the fundamental law of physics that degradation (or entropy) always increases over time.

Accordingly, the constraint convex regression problem is to find an optimal solution such that $$\underset{\psi \in \{convex\}}{\text{minimize}} \sum_{n=0}^{N} (y_n - \psi(t_n))^2 \qquad (3)$$

$$\text{subject to } \lim_{y \to \infty} \psi^{-1}(y) < \infty$$

$$\partial \psi(t) / \partial t > 0, \ \forall \, t \geq 0.$$

In some embodiments, instead of solving the abstract non-parametric optimization problem shown above, the system can use a function having one or more unknown parameters that satisfy the constraints indicated by formulas (1) and (2) to represent the convex function and then solve the parametric optimization function. In some embodiments, the system can assume $$\psi(t) = (1 + \beta t)^{-\frac{1}{k}}.$$

It can be proved that this expression satisfies constraints (1) and (2) if $1 \leq k < \infty$ and $-\infty < \beta < 0$. Given $$\psi(t) = (1 + \beta t)^{-\frac{1}{k}},$$

the optimization problem can be shown in the following simpler form:

$$\underset{\beta < 0, 1 \leq k}{\text{minimize}} \sum_{n=0}^{N} (y_n^{-k} - (1 + \beta t_n))^2, \qquad (4)$$

where its asymptotic life (i.e., TUL) and RUL at t can be found by $$-\frac{1}{\beta} \text{ and } t + \frac{1}{\beta}.$$

Figure 2:
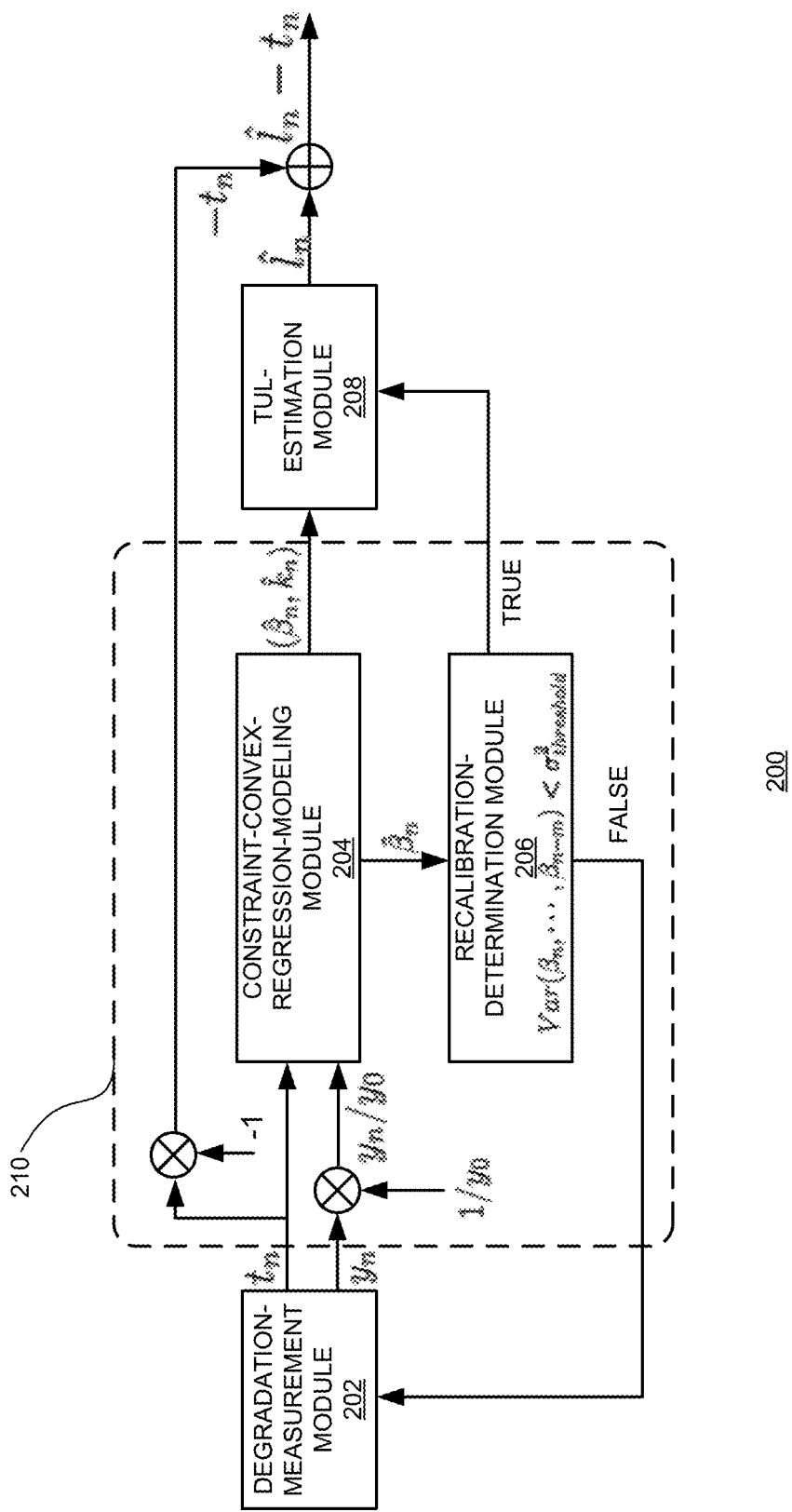
FIG. 2 illustrates the exemplary total useful life (TUL)-estimation system architecture, according to one embodiment.

The optimization problem shown in (4) can be solved using a constraint convex regression model. More specifically, based on the degradation measurement, one can estimate the model parameters (e.g., β and k). Based on the estimated model parameters, one can obtain the TUL estimation. FIG. 2 illustrates the exemplary TUL-estimation system architecture, according to one embodiment.

TUL-estimation system 200 can include a degradation-measurement module 202, a constraint-convex-regression-modeling module 204, a recalibration-determination module 206, and a TUL-estimation module 208. More specifically, constraint-convex-regression-modeling module 204 and recalibration-determination module 206 together form constraint-convex-regression core 210.

Degradation-measurement module 202 can be responsible for measuring degradation. In some embodiments, degradation-measurement module 202 can include a number of sensors embedded in the equipment of interest. For example, electrical, thermal, or magnetic resistance sensors can be used to measure, respectively, the electrical, thermal, or magnetic resistance. Moreover, other types of sensors can also be useful in obtaining degradation measurements. For example, certain imaging sensors (which can be optical or acoustic) can provide information regarding the size of the microcracks. The degradation measurement data can be normalized and sent, along with the time index, to constraint-convex-regression-modeling module 204. In some embodiments, the degradation measurement data can be sent to a computer system implementing constraint-convex-regression-modeling module 204 via a wired or wireless network.

Constraint-convex-regression-modeling module 204 models the convex behavior of the degradation measurement and estimates the model parameters (e.g., β and k) based on the measurement data. More specifically, constraint-convex-regression-modeling module 204 uses a convex-regression technique to solve the optimization problem:

$$(\hat{\beta}_n, \hat{k}_n) = \underset{\beta<0, k\geq 1, 0\leq w_{n'}\leq 1}{\text{minimize}} \sum_{n'=0}^{N} w_{n'} (y_{n'}^{-k} - (1+\beta t_{n'}))^2, \quad (6)$$

where w' is a weight function. In some embodiments, more recent degradation measurement data is assigned a greater weight.

Recalibration-determination module 206 can be responsible for determining whether the outputs of the constraint-convex-regression-modeling module 204 need to be recalibrated. In some embodiments, recalibration-determination module 206 can calculate the variance of the model parameter. For example, if the variance of the model parameters (e.g., β) across a predetermined number of time intervals is less than a predetermined threshold (i.e., Var(β$_n$, . . . , β$_{n-m}$)<σ$_{threshold}^2$), then the outputs of recalibration-determination module 206 are considered valid and can be sent to TUL-estimation module 208. Otherwise, recalibration is needed and a new degradation measurement is taken. The new degradation measurement data can then be sent to constraint-convex-regression-modeling module 204 to be used for model parameter estimation.

TUL-estimation module 208 can estimate the total useful life (TUL) of the equipment of interest based on the current model parameters. More specifically, TUL-estimation module 208 can estimate the current TUL (e.g., at $t_n$) by solving an optimization problem:

$$\hat{l}_n = \underset{1<y_i<\infty}{\text{minimize}} y_i \quad (7)$$

$$\text{subject to } \frac{t(y_i+\Delta y)-t(y_i)}{\Delta y} < \varepsilon$$

$$t(y) = \hat{\beta}_n^{-1}(y^{-\hat{k}_n}-1),$$

where ε is a threshold value. The current RUL of the equipment of interest can then be calculated as: RUL=$\hat{l}_n$−$t_n$, where $\hat{l}_n$ is the current TUL estimation and $t_n$ is the current time. Formula (7) shows the predict TUL converging.

Figure 3A:
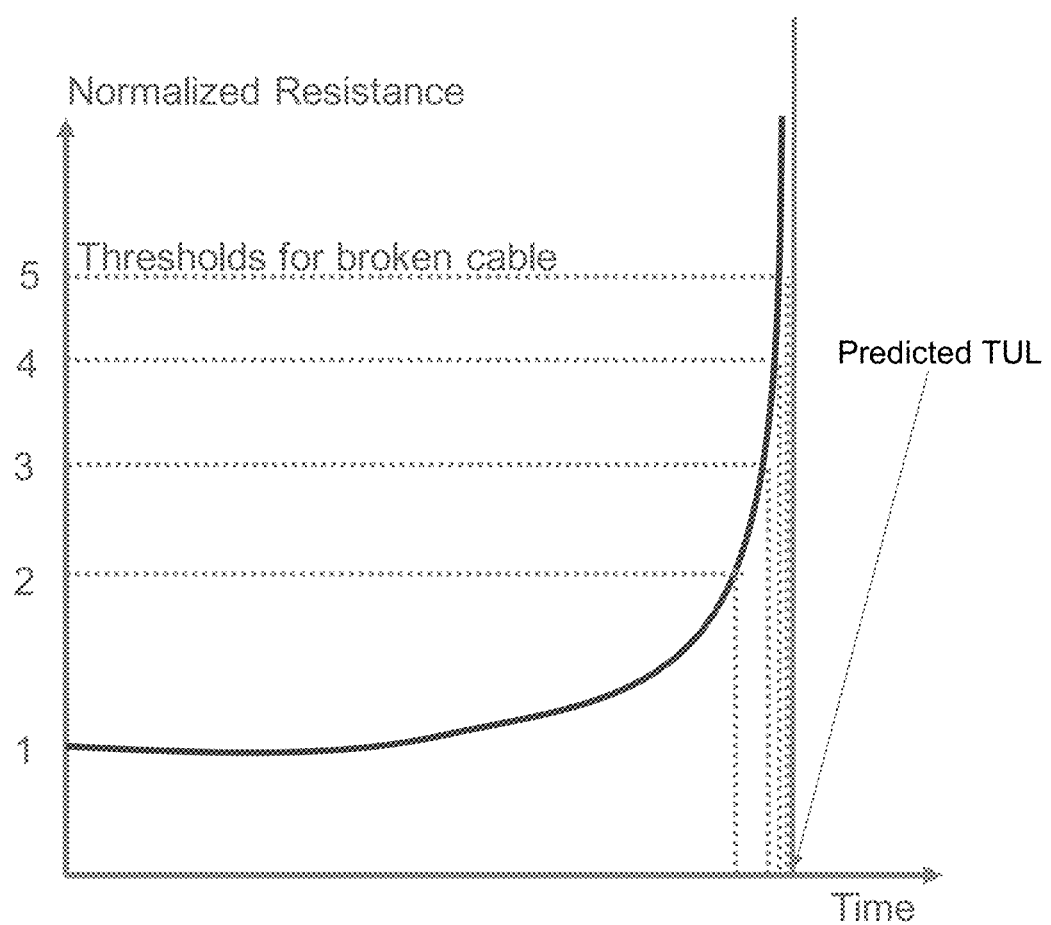
FIG. 3A illustrates the estimated degradation function, according to one embodiment.
Figure 3B:
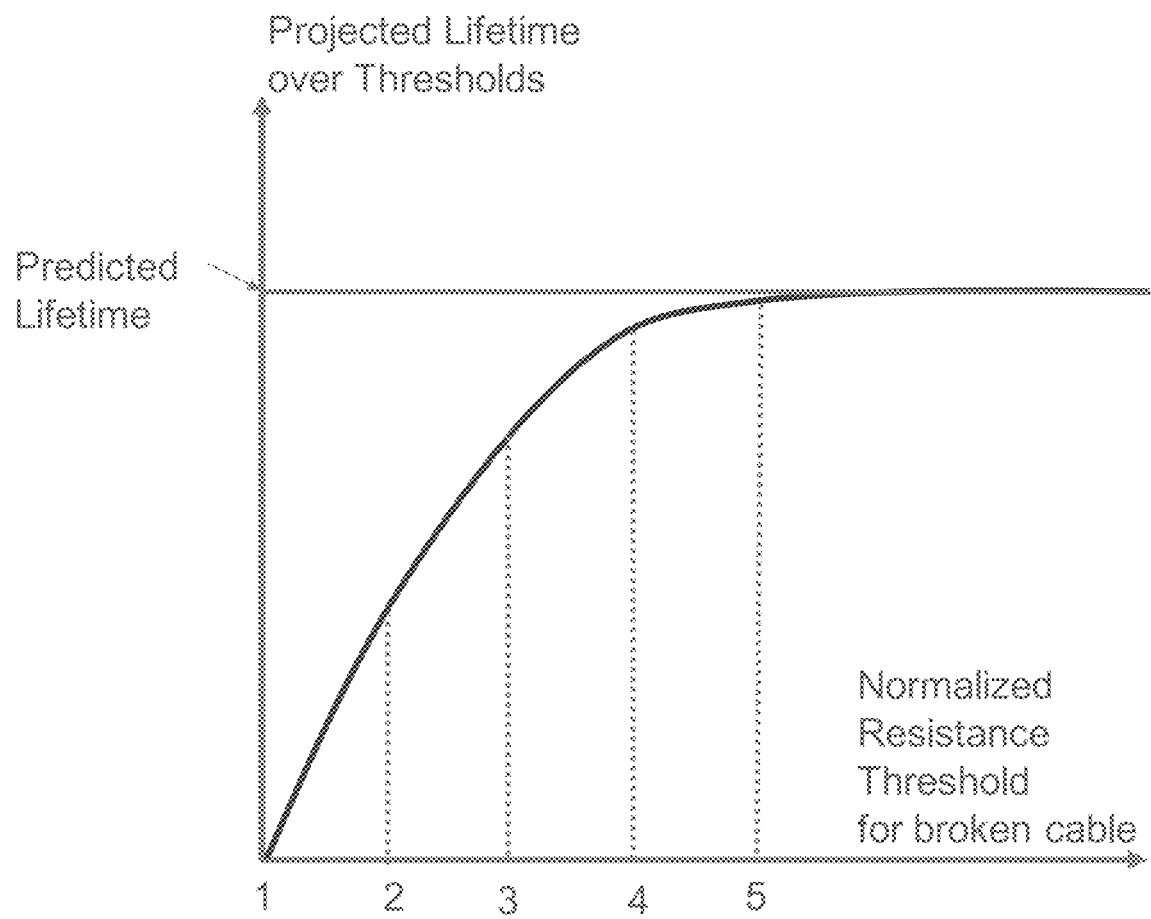
FIG. 3B shows the inverse function of the degradation function, according to one embodiment.

FIG. 3A illustrates the estimated degradation function, according to one embodiment. In this example, the degradation measurement data includes normalized resistance (e.g., electrical resistance) of a cable. As discussed previously, the normalized resistance will increase to infinity (which indicates a broken cable) as the time approaches the TUL. FIG. 3A also shows different threshold values can be set to stop the cable operation. FIG. 3B shows the inverse function of the degradation function, according to one embodiment. From FIG. 3B, one can see that given the degradation measurement, one can infer the predicted TUL, which converges to a single value. Note that, as the degradation measurement is updated, so will be the model parameters of the degradation function. Therefore, the TUL prediction is also updated or refreshed. By adaptively updating the TUL prediction, one can ensure the accurate estimation of the RUL.

Figure 4:
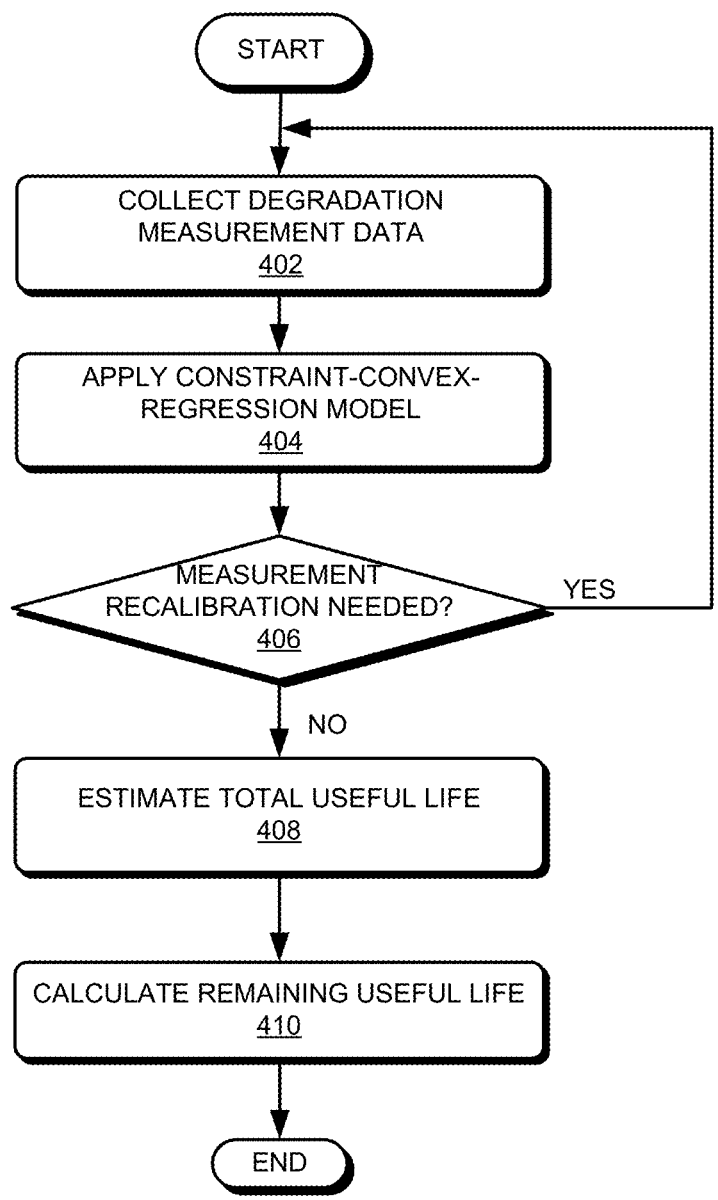
FIG. 4 presents a flowchart illustrating an exemplary process for estimating remaining useful life (RUL), according to one embodiment.

FIG. 4 presents a flowchart illustrating an exemplary process for estimating RUL, according to one embodiment. During operation, the system collects degradation measurement data associated with a piece of equipment or structure under investigation (operation 402). In some embodiments, the system may continuously monitor the degradation measurement. In some embodiments, the system may collect degradation data at a predetermined sampling interval. The degradation data can be collected by one or more sensors embedded in or attached to the equipment or structure under investigation.

The system then uses a constraint-convex-regression modeling technique to fit the degradation measurement data to a convex function (operation 404). In some embodiments, the convex function can be an asymptotic function. The system can further estimate the model parameters based on the degradation measurement data. In some embodiments, the system can adaptively update the model parameters as new measurement data is being received. In some embodiments, applying the constraint-convex-regression model can also involve assigning weight factors (which can be a number between 0 and 1) to the received degradation measurement data. Recent measurement data can be assigned a larger weight, whereas older measurement data can receive a smaller weight.

Before outputting the model parameters, the system determines whether measurement recalibration is needed (operation 406). Due to the possibility of measurement errors, the model parameters sometimes may not make physical sense or may not be a good explanation of the model. In some embodiments, the system can calculate the variance of the model parameters. Abrupt changes in model parameters (e.g., if the variance is greater than a predetermined threshold) may indicate measurement errors. If a recalibration measurement is needed, the system collects new measurement data (operation 402). Otherwise, the system estimates the TUL based on the current model parameters (operation 408) and calculates RUL based on the TUL and the current time (operation 410). Note that as new measurement data is collected, the TUL and RUL are also being updated. In some embodiments, when the RUL is below a predetermined threshold, the system may send a warning signal or alert to a control or management unit of the equipment under investigation. The control or management unit can then arrange appropriate maintenance or replacement of the equipment.

Particle-Filtering Framework for RUL Distribution Estimation

Figure 5:
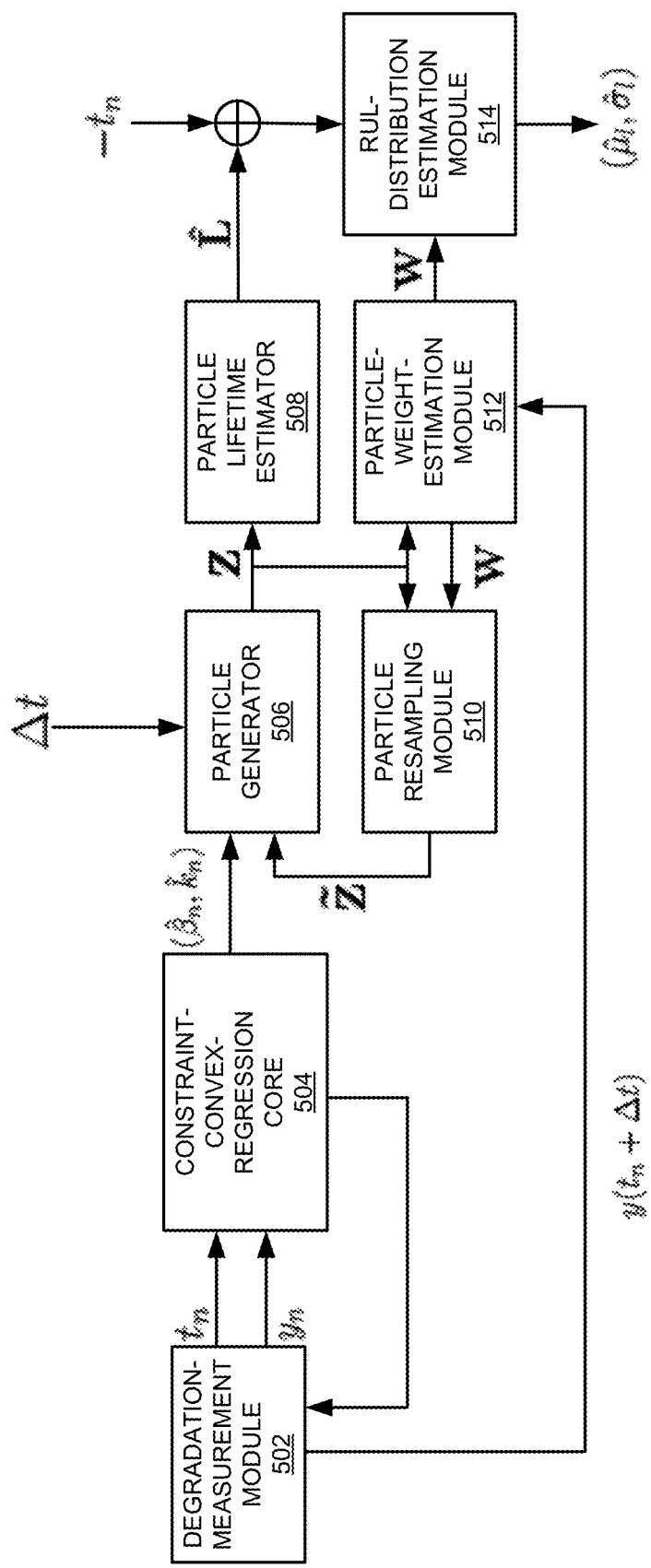
FIG. 5 illustrates the exemplary RUL-distribution estimation system architecture, according to one embodiment.

In some embodiments, instead of predicting the TUL or RUL as a single value, the system can estimate the probability distribution of the TUL or RUL. More specifically, the system can estimate RUL distribution using stochastic constraint convex regression. FIG. 5 illustrates the exemplary RUL-distribution estimation system architecture, according to one embodiment.

In FIG. 5, RUL-distribution-estimation system 500 can include a degradation-measurement module 502, a constraint-convex-regression core 504, a particle generator 506, a particle lifetime estimator 508, a particle resampling module 510, a particle-weight-estimation module 512, and an RUL-distribution estimation module 514.

Degradation-measurement module 502 can be similar to degradation-measurement module 202 shown in FIG. 2. Constraint-convex-regression core 504 can be similar to constraint-convex-regression core 210 shown in FIG. 2. More specifically, constraint-convex-regression core 504 can be responsible for estimating the parameters (e.g., $\beta$ and k) of the convex regression model.

The model parameters can be sent to particle generator 506, which is responsible for generating particles. In some embodiments, particle generator 506 can generate Brownian Motion (BM) particles with BM parameters. The input of particle generator 506 can include current time, degradation measurement, and particle state (e.g., $(t_n, y_n, z)$), estimated model parameters (e.g., $(\hat{\beta}_n, \hat{k}_n)$), next prediction time interval $\Delta t$, and particle parameters (e.g., $(\Delta\beta, \hat{\sigma}_\varepsilon, \eta)$), where $\hat{\sigma}_\varepsilon$ is estimated particle variance. The output of particle generator 506 can include the next particle state (e.g., $(z_{next}, \Delta\beta, \hat{\sigma}_\varepsilon)$). FIG. 6A shows the pseudocode for generating particles, according to one embodiment.

Returning to FIG. 5, particle lifetime estimator 508 can predict the lifetime of particles using a convex-regression model. In some embodiments, the input of particle lifetime estimator 508 can be the particle states and the output can be the estimated particle lifetimes. FIG. 6B shows the pseudocode for estimating the lifetime of particles, according to one embodiment.

Returning to FIG. 5, particle resampling module 510 can be responsible for particle resampling. More specifically, a standard particle-filtering algorithm (e.g., Kalman filter) can be used for particle resampling. Particle-weight-estimation module 512 can be responsible for estimating the weighted mean and variance of a particle's lifetime. The input of particle-weight-estimation module 512 can include particle state $z_n$, degradation measurement $y_n$, and particle variance estimate $\hat{\sigma}_\varepsilon$. FIG. 6C shows the pseudocode for estimating the particles' weights, according to one embodiment.

Returning to FIG. 5, RUL-distribution estimation module 514 can be responsible for computing a weighted average of variance of RUL for a normal distribution given particles' lifetime and the current time. The input to RUL-distribution estimation module 514 can include the particles' lifetime estimate L, and the particles' weight estimate w. The output of RUL-distribution estimation module 514 can be the mean $\hat{\mu}_l$ and variance $\hat{\sigma}_l^2$ of the normal distribution (RUL$\square$N(l|$\mu_l$, $\sigma_l$)). FIG. 6D shows the pseudocode for estimating the RUL distribution, according to one embodiment.

Figure 7:
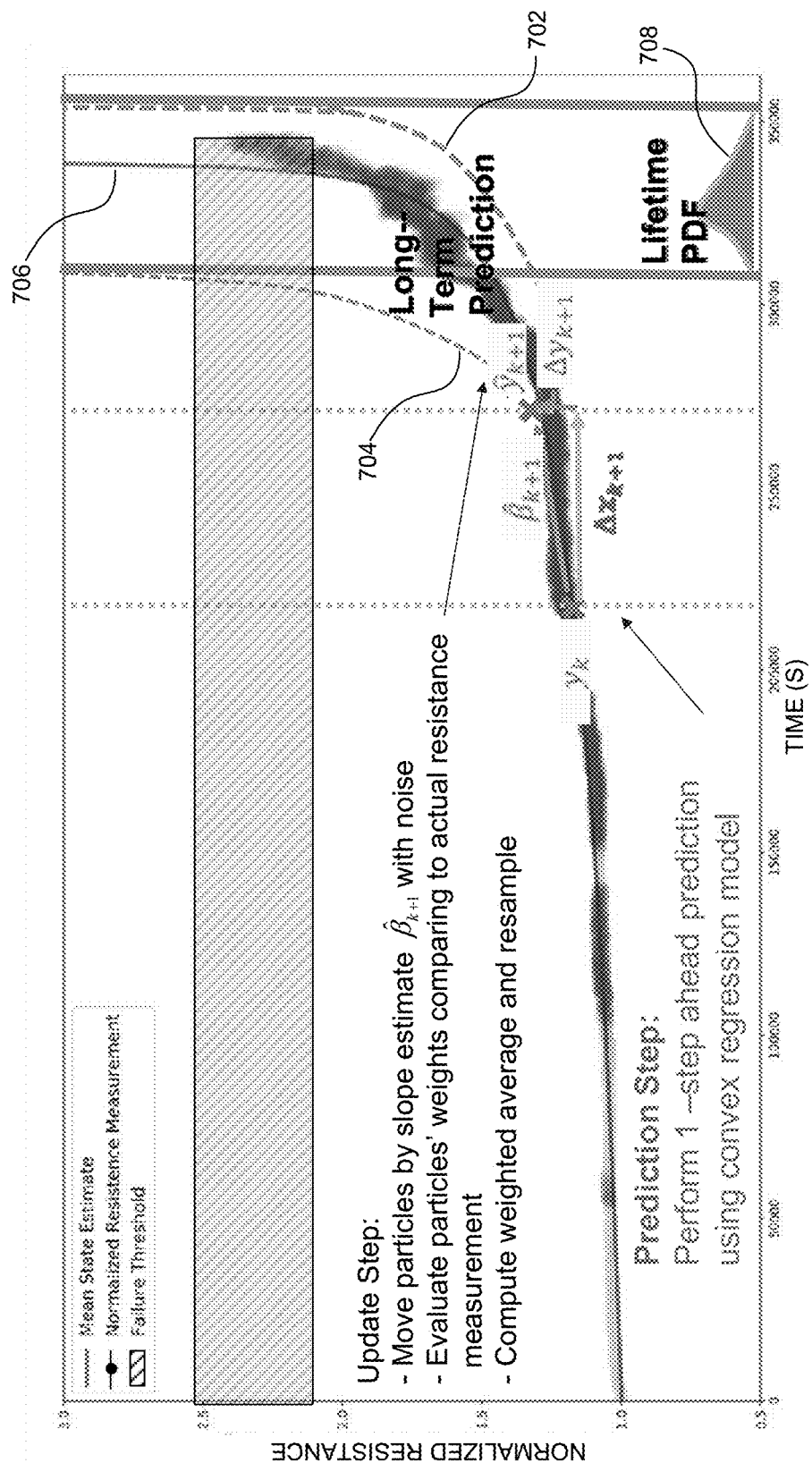
FIG. 7 illustrates an RUL-distribution estimation example, according to one embodiment.

FIG. 7 illustrates an RUL-distribution estimation example, according to one embodiment. In FIG. 7, the vertical axis indicates the value of the degradation measurement. In this example, the vertical axis indicates the normalized resistance of a load-bearing cable. The horizontal axis indicates time. As one can see from the drawing, the normalized resistance increases with time, indicating that cracks have developed in the load-bearing cable.

FIG. 7 also shows that during the prediction step, the system uses convex-regression modeling to predict the total useful life of the cable (as indicated by curve 702. During the update operation, the system can move the particles by an estimated slope $\hat{\beta}_{k+1}$ with noise. This estimation corresponds to curve 704. The system can then evaluate the particles' weights comparing to actual resistance measurement and resample the particles. Curve 706 shows the average state estimation result, which is the long-term prediction of the resistance. The dots show the actual resistance measurement result, which fits well to the long-term prediction. The distribution of the predicted lifetime of the cable is shown by curve 708.

Figure 8:
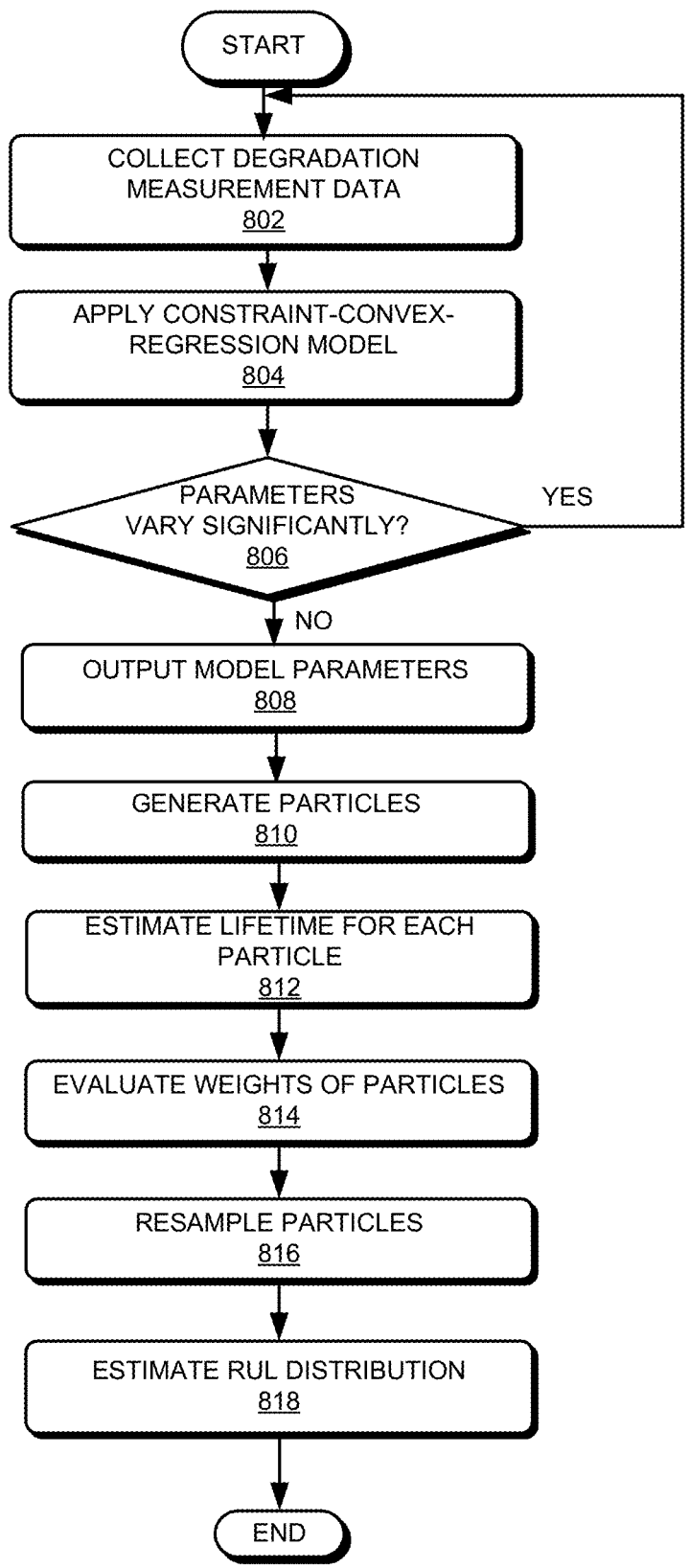
FIG. 8 presents a flowchart illustrating an exemplary process for estimating the RUL distribution, according to one embodiment.

FIG. 8 presents a flowchart illustrating an exemplary process for estimating the RUL distribution, according to one embodiment. During operation, the system may collect degradation measurement data associated with a piece of equipment or structure under investigation (operation 802). Various sensors embedded in the equipment or structures can be used to collect degradation measurement data, such as sensors for measurement of electrical, thermal, or magnetic resistance.

Subsequent to collecting a predetermined amount of data (e.g., after collecting data for a predetermined time), the system can use a constraint-convex-regression modeling technique to fit the current degradation measurement data to a convex function having unknown parameters (operation 804). The system then determines whether the current model parameters vary significantly from previously obtained model parameters (operation 806). If so, the system collects more degradation measurement data (operation 802). If not, the system outputs the model parameters (operation 808). Operations 802-806 can be similar to operation 402-406 shown in FIG. 4.

The system generates a plurality of particles based on parameters obtained from the constraint convex regression model (operation 810). More specifically, the system can generate Brownian particles by adding Brownian noise to predicted model parameters at the next time interval. The system uses a convex regression model to estimate the lifetime corresponding to each particle (operation 812). Operation 812 can be similar to operation 804, except that the model input is particles not degradation measurement data. The system can then evaluate the weights of the particles based on the current measurement result (operation 814) and resample the particles based on their weights (operation 816). Only particles with larger weights are kept. Once the convergence is reached, the system can estimate the RUL distribution based on the weights of the remaining particles and their corresponding lifetime estimation (operation 818).

Exemplary Computer System and Apparatus

Figure 9:
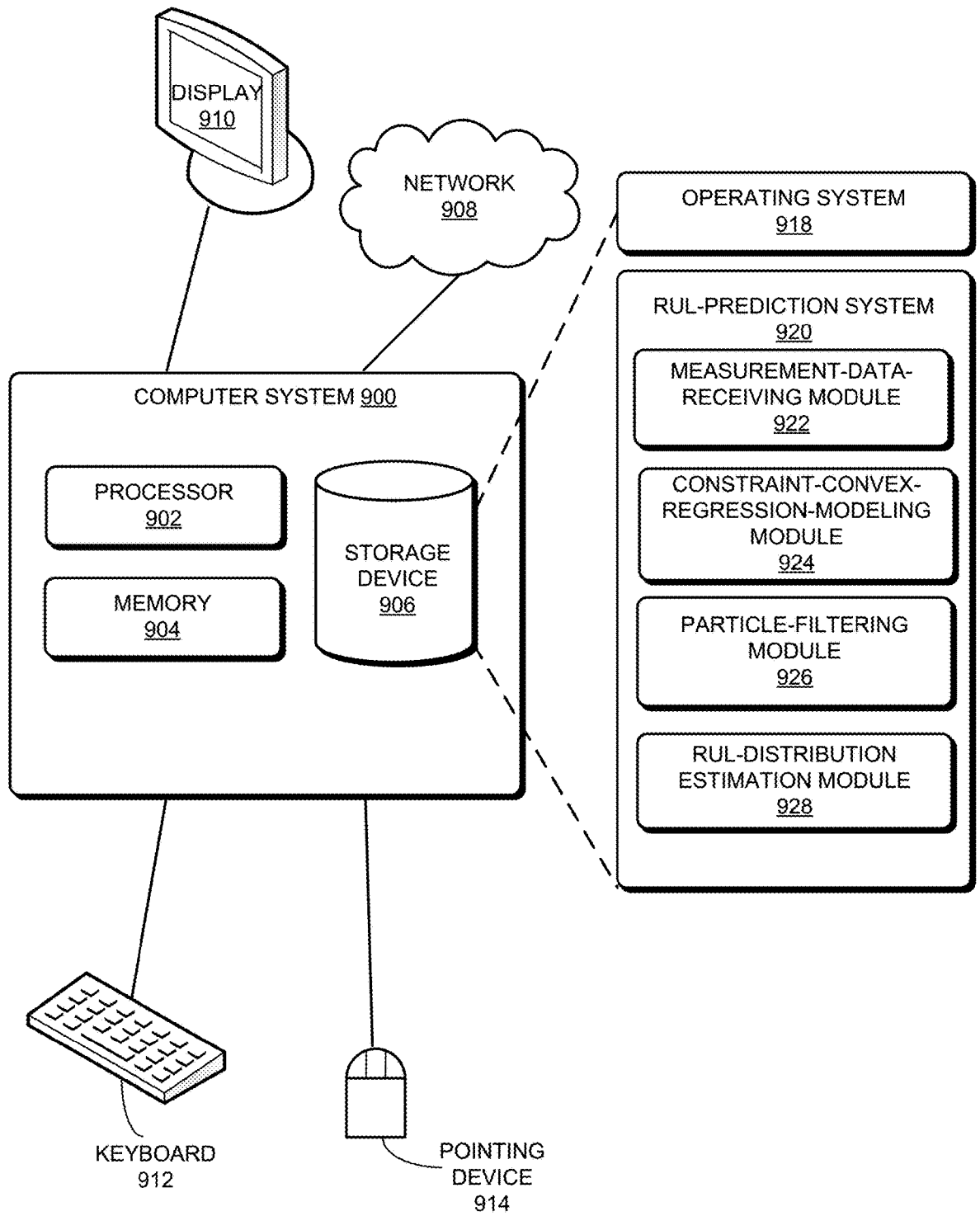
FIG. 9 illustrates an exemplary computer system that facilitates an RUL-prediction system, according to one embodiment.

FIG. 9 illustrates an exemplary computer system that facilitates an RUL-prediction system, according to one embodiment. Computer system 900 includes a processor 902, a memory 904, and a storage device 906. Computer system 900 can be coupled to a display device 910, a keyboard 912, and a pointing device 914, and can also be coupled via one or more network interfaces to network 908. Storage device 906 can store an operating system 918, and an RUL-prediction system 920.

RUL-prediction system 920 can include instructions, which when executed by computer system 900 can cause computer system 900 to perform methods and/or processes described in this disclosure. RUL-prediction system 920 can also include instructions for receiving degradation measurement data (measurement-data-receiving module 922) and instructions for applying a constraint convex regression model (constraint-convex-regression-modeling module 924). Furthermore, RUL-prediction system 920 can include instructions for applying a particle filter (particle-filtering module 926) and instructions for estimating the RUL distribution (RUL-distribution estimation module 928).

Figure 10:
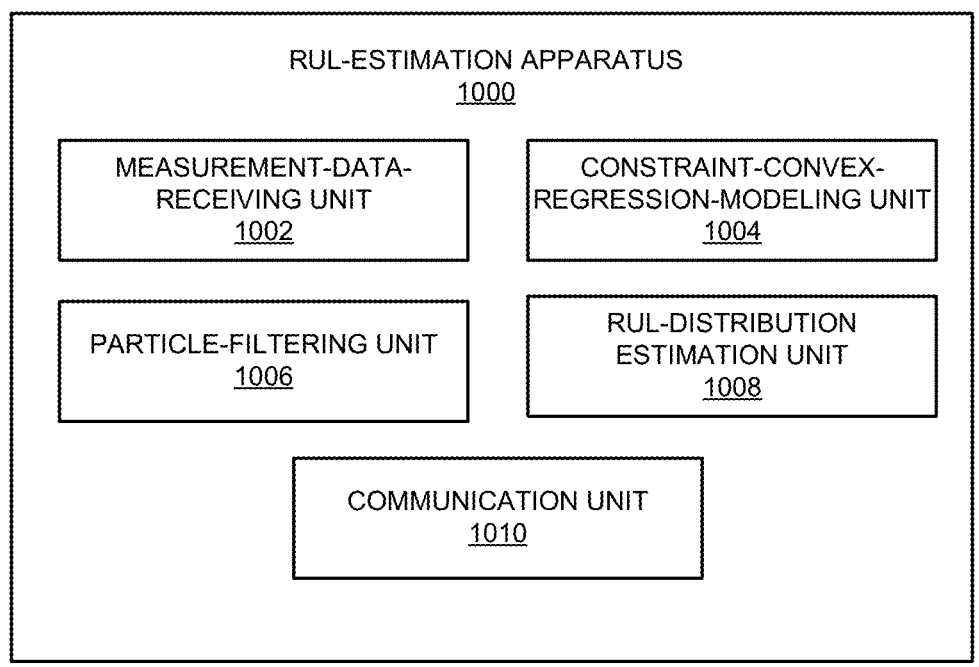
FIG. 10 illustrates an exemplary apparatus that facilitates an RUL-estimation system, according to one embodiment.

FIG. 10 illustrates an exemplary apparatus that facilitates an RUL-estimation system, according to one embodiment. Apparatus 1000 can comprise a plurality of units or apparatuses that may communicate with one another via a wired, wireless, quantum light, or electrical communication channel. Apparatus 1000 may be realized using one or more integrated circuits, and may include fewer or more units or apparatuses than those shown in FIG. 10. Further, apparatus 1000 may be integrated in a computer system, or realized as a separate device that is capable of communicating with other computer systems and/or devices. Specifically, apparatus 1000 can comprise units 1002-1008, which perform functions or operations similar to modules 922-928 of computer system 900 of FIG. 9, including: a measurement-data-receiving unit 1002, a constraint-convex-regression-modeling unit 1004, a particle-filtering unit 1006, and an RUL-distribution estimation unit 1008. Apparatus 1000 can further include a communication unit 1010.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for estimating useful life of a load-bearing structure, the method comprising:
performing degradation measurement on the load-bearing structure to obtain degradation data for a plurality of time periods;
applying a constraint convex regression model to the degradation data to fit the degradation data to a convex function comprising one or more function parameters, which comprises:
for each time period, estimating the function parameters of the convex function based on degradation data associated with the time period;
calculating variance of each function parameter based on corresponding estimated function parameters for the plurality of time periods;
determining whether the calculated variance of a function parameter exceeds a predetermined threshold; and
in response to determining that the calculated variance of the function parameter exceeds the predetermined threshold, performing new degradation measurement to obtain new degradation data;
estimating a total useful life (TUL) of the load-bearing structure based on outputs of the constraint convex regression model; and
predicting a remaining useful life (RUL) based on the TUL and a current time.

2. The method of claim 1, wherein the load-bearing structure comprises a load-bearing cable, and wherein performing the degradation measurement comprises one or more of:
measuring an electrical resistance;
measuring a thermal resistance; and
measuring a magnetic resistance.

3. The method of claim 1, further comprising:
performing additional degradation measurement for a number of subsequent time periods; and
updating the estimated TUL based on the additional degradation measurement.

4. The method of claim 3, further comprising:
using a particle-filtering technique to estimate a probability distribution of the estimated TUL based on the outputs of the constraint convex regression model and the additional degradation measurement.

5. The method of claim 4, wherein the particle-filtering technique comprises Kalman filtering.

6. The method of claim 1, wherein the convex function comprises an asymptotic function.

7. An apparatus for estimating useful life of a load-bearing structure, comprising:
one or more sensors embedded in the load-bearing structure, wherein the sensors are configured to obtain degradation data for a plurality of time periods;
a constraint convex regression modeling module configured to apply a constraint convex regression model to degradation data to fit the degradation data to a convex function comprising one or more function parameters, wherein applying the constraint convex regression model comprises:
for each time period, estimating the function parameters of the convex function based on degradation data associated with the time period;
calculating variance of each function parameter based on corresponding estimated function parameters for the plurality of time periods;
determining whether the calculated variance of a function parameter exceeds a predetermined threshold; and in response to determining that the calculated variance of the function parameter exceeds the predetermined threshold, performing new degradation measurement to obtain new degradation data;

a total useful life (TUL) estimation module configured to estimate a TUL of the load-bearing structure based on outputs of the constraint convex regression model; and a remaining useful life (RUL) prediction module configured to predict an RUL based on the TUL and a current time.

8. The apparatus of claim 7, wherein the load-bearing structure comprises a load-bearing cable, and wherein the degradation data comprises one or more of:

an electrical resistance;
a thermal resistance; and
a magnetic resistance.

9. The apparatus of claim 7, wherein the one or more sensors are further configured to obtain additional degradation data for a number of subsequent time periods, and wherein the TUL estimation module is further configured to update the estimated TUL based on the additional degradation data.

10. The apparatus of claim 9, further comprising a particle-filtering module configured to use a particle-filtering technique to estimate a probability distribution of the TUL based on the outputs of the constraint convex regression model and the additional degradation data.

11. The apparatus of claim 10, wherein the particle-filtering technique comprises Kalman filtering.

12. The apparatus of claim 7, wherein the convex function comprises an asymptotic function.

13. A non-transitory computer-readable storage medium storing instructions that when executed by a computer cause the computer to perform a method for estimating useful life of a load-bearing structure, the method comprising:

performing degradation measurement on the load-bearing structure to obtain degradation data for a plurality of time periods;

applying a constraint convex regression model to the degradation data to fit the degradation data to a convex function comprising one or more function parameters, which comprises:

for each time period, estimating the function parameters of the convex function based on degradation data associated with the time period;

calculating variance of each function parameter based on corresponding estimated function parameters for the plurality of time periods;

determining whether the calculated variance of estimated function parameter exceeds a predetermined threshold; and in response to determining that the calculated variance of the function parameter exceeds the predetermined threshold, performing new degradation measurement to obtain new degradation data;

estimating a total useful life (TUL) of the load-bearing structure based on outputs of the constraint convex regression model; and predicting a remaining useful life (RUL) based on the TUL and a current time.

14. The non-transitory computer-readable storage medium of claim 13, wherein the load-bearing structure comprises a load-bearing cable, and wherein performing the degradation measurement comprises one or more of:

measuring an electrical resistance;
measuring a thermal resistance; and
measuring a magnetic resistance.

15. The non-transitory computer-readable storage medium of claim 13, wherein the method further comprises:

performing additional degradation measurement for a number of subsequent time periods; and updating the TUL estimation based on the additional degradation measurement.

16. The non-transitory computer-readable storage medium of claim 15, wherein the method further comprises using a particle-filtering technique to estimate a probability distribution of the TUL based on the outputs of the constraint convex regression model and the additional degradation measurement, and wherein the particle-filtering technique comprises Kalman filtering.

17. The non-transitory computer-readable storage medium of claim 13, wherein the convex regression function comprises an asymptotic function.

* * * * *